United States Patent
Bae et al.

(10) Patent No.: US 11,456,198 B2
(45) Date of Patent: Sep. 27, 2022

(54) TRANSFER UNIT AND SUBSTRATE TREATING APPARATUS INCLUDING THE SAME

(71) Applicant: SEMES CO., LTD., Chungcheongnam-do (KR)

(72) Inventors: Moon Hyung Bae, Daegu (KR); Min Jung Park, Daegu (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 83 days.

(21) Appl. No.: 16/999,469

(22) Filed: Aug. 21, 2020

(65) Prior Publication Data
US 2021/0057253 A1   Feb. 25, 2021

(30) Foreign Application Priority Data
Aug. 23, 2019  (KR) .......................... 10-2019-0103639

(51) Int. Cl.
*H01L 21/67* (2006.01)
*H01L 21/677* (2006.01)
*H01L 21/683* (2006.01)

(52) U.S. Cl.
CPC .. *H01L 21/67748* (2013.01); *H01L 21/67751* (2013.01); *H01L 21/6831* (2013.01)

(58) Field of Classification Search
None
See application file for complete search history.

(56) References Cited

U.S. PATENT DOCUMENTS

| 10,083,851 B2 * | 9/2018 | Inada .................... F16C 29/088 |
| 2004/0144316 A1 * | 7/2004 | Lee .................. H01L 21/67766 118/719 |
| 2009/0211595 A1 * | 8/2009 | Sinha ....................... B08B 7/00 134/1 |

FOREIGN PATENT DOCUMENTS

| JP | 07-039787 A | 2/1995 |
| JP | H 1028896 * | 2/1998 ............... B03C 3/14 |

(Continued)

OTHER PUBLICATIONS

Office Action from the Korean Patent Office in respect of the related Korean Patent Application, dated Sep. 7, 2020 (10 pages).

(Continued)

*Primary Examiner* — Ronald P Jarrett
(74) *Attorney, Agent, or Firm* — Procopio, Cory, Hargreaves & Savitch LLP

(57) ABSTRACT

An apparatus for treating a substrate includes an index module and a treatment module that treats the substrate. The index module includes a load port on which a carrier having a plurality of substrates received therein is loaded and a transfer frame that is disposed between the treatment module and the load port and that transfers the substrate between the carrier loaded on the load port and the treatment module. The treatment module includes one or more process chambers and a transfer chamber that transfers the substrate to the process chambers. The transfer chamber includes a housing having a transfer space in which the substrate is transferred, a transfer robot that is disposed in the housing and that transfers the substrate between the process chambers, and an electrostatic pad that is provided in the transfer space and that electro-statically attracts particles in the housing.

16 Claims, 10 Drawing Sheets

(56) References Cited

FOREIGN PATENT DOCUMENTS

| | | | | | |
|---|---|---|---|---|---|
| JP | 2005093812 | A | 4/2005 | | |
| JP | 2017-112137 | A | 6/2017 | | |
| JP | 2018037475 | A | 3/2018 | | |
| KR | 10-0560599 | B1 | 3/2006 | | |
| KR | 101153328 | B1 | 6/2012 | | |
| KR | 10-2016-0145164 | A | 6/2014 | | |
| KR | 1020140072998 | A | 6/2014 | | |
| KR | 20140102366 | | * 8/2014 | ........... | H01L 21/677 |
| KR | 10-1680421 | B1 | 11/2016 | | |
| WO | WO 2019219163 | | * 11/2019 | | |

OTHER PUBLICATIONS

Office Action for related Korean Patent Application No. 10-2019-0103639 dated May 25, 2021 (8 pages).

* cited by examiner

TRANSFER UNIT AND SUBSTRATE TREATING APPARATUS INCLUDING THE SAME

CROSS-REFERENCE TO RELATED APPLICATIONS

A claim for priority under 35 U.S.C. § 119 is made to Korean Patent Application No. 10-2019-0103639 filed on Aug. 23, 2019, in the Korean Intellectual Property Office, the entire contents of which are hereby incorporated by reference.

BACKGROUND

Embodiments of the inventive concept described herein relate to a transfer unit and a substrate treating apparatus including the same.

Various processes, such as photolithography, cleaning, and the like, are performed to manufacture semiconductor elements and flat panel displays. The processes are performed in chambers having independent spaces, and a substrate is transferred to the chambers according to a process sequence by a transfer robot.

In general, a substrate treating process requires a clean state in which particles such as dust are removed. Even though the inside of a chamber is made clean before a process starts, a poor process is caused by particles generated while a substrate is transferred. The particles are mainly generated in an apparatus for transferring the substrate. More specifically, a large amount of particles are generated due to friction between parts in a drive member that transmits power to the apparatus.

Relatively large particles can be removed by using a fan filter unit. However, relatively small particles are not removed well in a transfer space.

SUMMARY

Embodiments of the inventive concept provide a transfer unit for minimizing a poor process caused by particles generated in a process of transferring a substrate, and a substrate treating apparatus including the transfer unit.

In addition, embodiments of the inventive concept provide a transfer unit for minimizing the release of particles generated in the transfer unit to the outside, and a substrate treating apparatus including the transfer unit.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes an index module and a treatment module that treats the substrate. The index module includes a load port on which a carrier having a plurality of substrates received therein is loaded and a transfer frame that is disposed between the treatment module and the load port and that transfers the substrate between the carrier loaded on the load port and the treatment module. The treatment module includes one or more process chambers and a transfer chamber that transfers the substrate to the process chambers. The transfer chamber includes a housing having a transfer space in which the substrate is transferred, a transfer robot that is disposed in the housing and that transfers the substrate between the process chambers, and an electrostatic pad that is provided in the transfer space and that electro-statically attracts particles in the housing.

According to an embodiment, the transfer chamber may further include a drive unit that moves the transfer robot, and the electrostatic pad may be provided in the drive unit.

According to an embodiment, the drive unit may include a main body having an opening formed therein, a sealing belt that is located to face the opening and seals the opening and to which a bracket coupled with the transfer robot is coupled, and an actuator that is disposed in the main body and that moves the sealing belt, and the electrostatic pad may be located in the main body so as to be adjacent to the opening.

According to an embodiment, the electrostatic pad may be attached to an inner wall of the housing.

According to an embodiment, the electrostatic pad may be provided on a sidewall parallel to a direction of movement of the transfer robot among sidewalls of the housing.

According to an embodiment, the transfer chamber may further include a fan filter unit that generates a vertical air flow in the housing.

According to an embodiment, the electrostatic pad may include a first pad formed of a material that attracts positively charged particles.

According to an embodiment, the electrostatic pad may include a second pad formed of a material that attracts negatively charged particles.

According to an embodiment, the electrostatic pad may include a first pad formed of a material that attracts positively charged particles and a second pad formed of a material that attracts negatively charged particles.

According to an embodiment, a plurality of first pads and a plurality of second pads may be provided, and the first pads and the second pads may be alternately disposed.

According to an embodiment, the first pad may contain one of Teflon, silicone, polyethylene, and vinyl chloride.

According to an embodiment, the second pad may contain one of nylon, acetate, and aluminum.

According to an exemplary embodiment, a transfer unit includes a housing having a space in which a substrate is transferred, a transfer robot that is disposed in the housing and that transfers the substrate between treatment modules, and an electrostatic pad that is provided in the housing and that electro-statically attracts particles in the housing.

According to an embodiment, the electrostatic pad may be provided on a sidewall parallel to a direction of movement of the transfer robot among sidewalls of the housing.

According to an embodiment, the transfer unit may further include a fan filter unit that generates a vertical air flow in the housing.

According to an embodiment, the electrostatic pad may include a first pad formed of a material that attracts positively charged particles.

According to an embodiment, the electrostatic pad may include a second pad formed of a material that attracts negatively charged particles.

According to an embodiment, the electrostatic pad may include a first pad formed of a material that attracts positively charged particles and a second pad formed of a material that attracts negatively charged particles.

According to an embodiment, a plurality of first pads and a plurality of second pads may be provided, and the first pads and the second pads may be alternately disposed.

According to an embodiment, the first pad may contain one of Teflon, silicone, polyethylene, and vinyl chloride.

According to an embodiment, the second pad may contain one of nylon, acetate, and aluminum.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
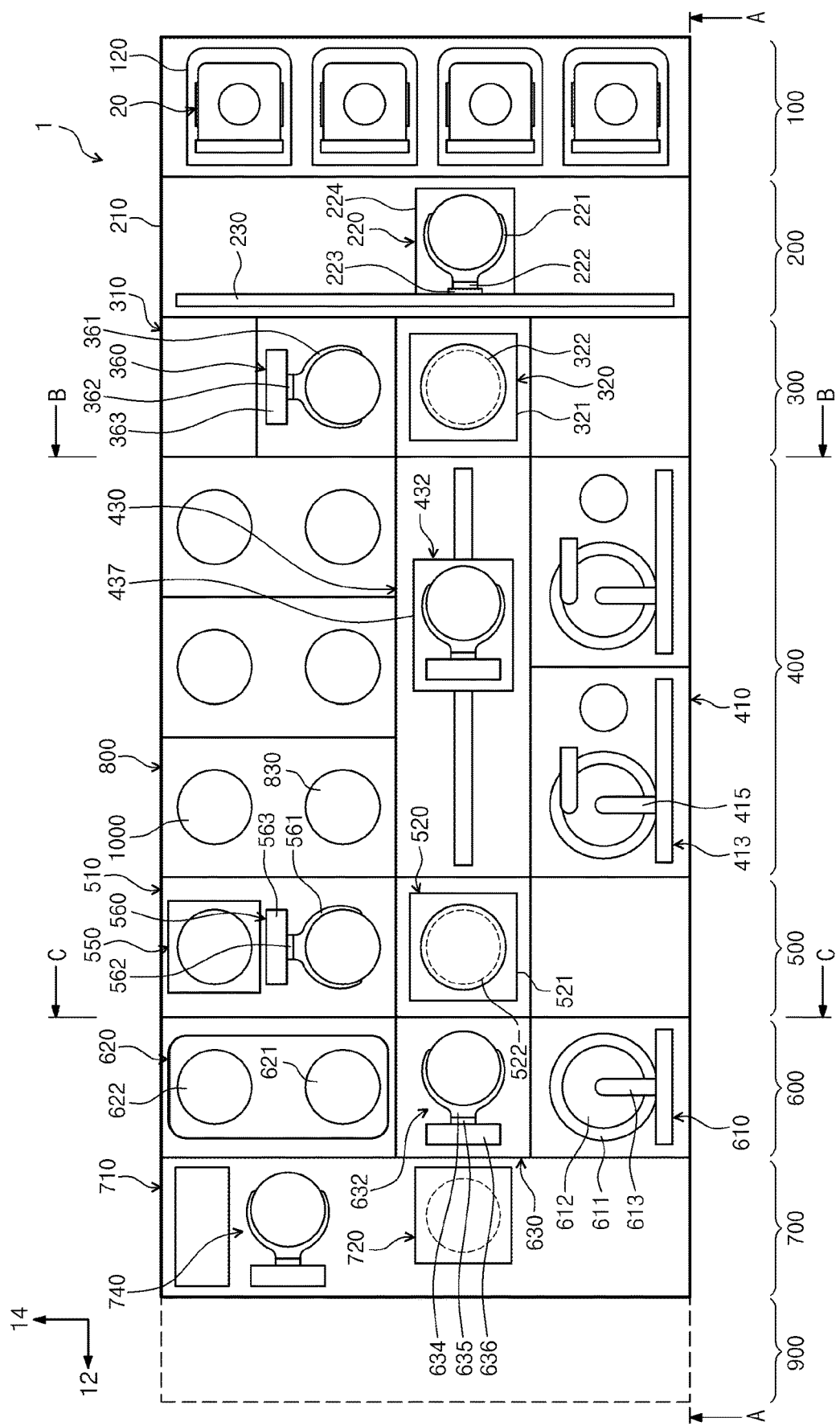
FIG. 1 is a plan view illustrating substrate treating equipment according to an embodiment of the inventive concept.

Hereinafter, embodiments of the inventive concept will be described in more detail with reference to the accompanying drawings. Various modifications and variations can be made to the embodiments of the inventive concept, and the scope of the inventive concept should not be construed as limited to the embodiments set forth herein. These embodiments are provided so that the inventive concept will be thorough and complete, and will fully convey the scope of the inventive concept to those skilled in the art. Accordingly, in the drawings, the shapes of components are exaggerated for clarity of illustration.

Substrate treating equipment of the inventive concept may be used to perform a photolithography process on a substrate such as a semiconductor wafer or a flat display panel. In particular, the substrate treating equipment of the inventive concept may be connected to a stepper and may be used to perform a coating process and a developing process on a substrate. However, the inventive concept is applicable to various apparatuses in which a gas flow is formed in a sealed space in which a substrate is treated. In the following description, it will be exemplified that a circular wafer is used as a substrate.

Figure 2:
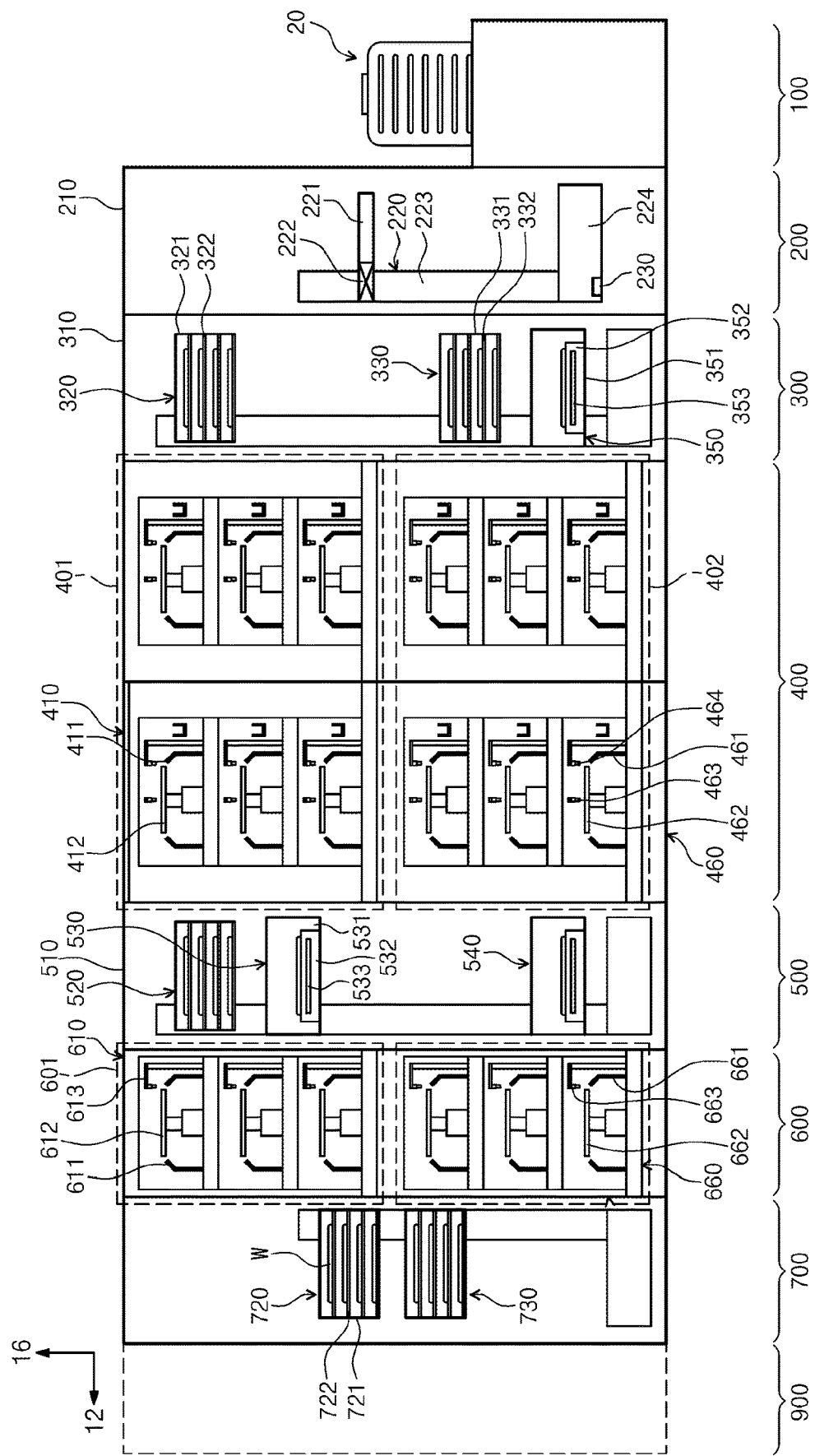
FIG. 2 is a view illustrating the equipment of FIG. 1 when viewed in direction A-A.
Figure 3:
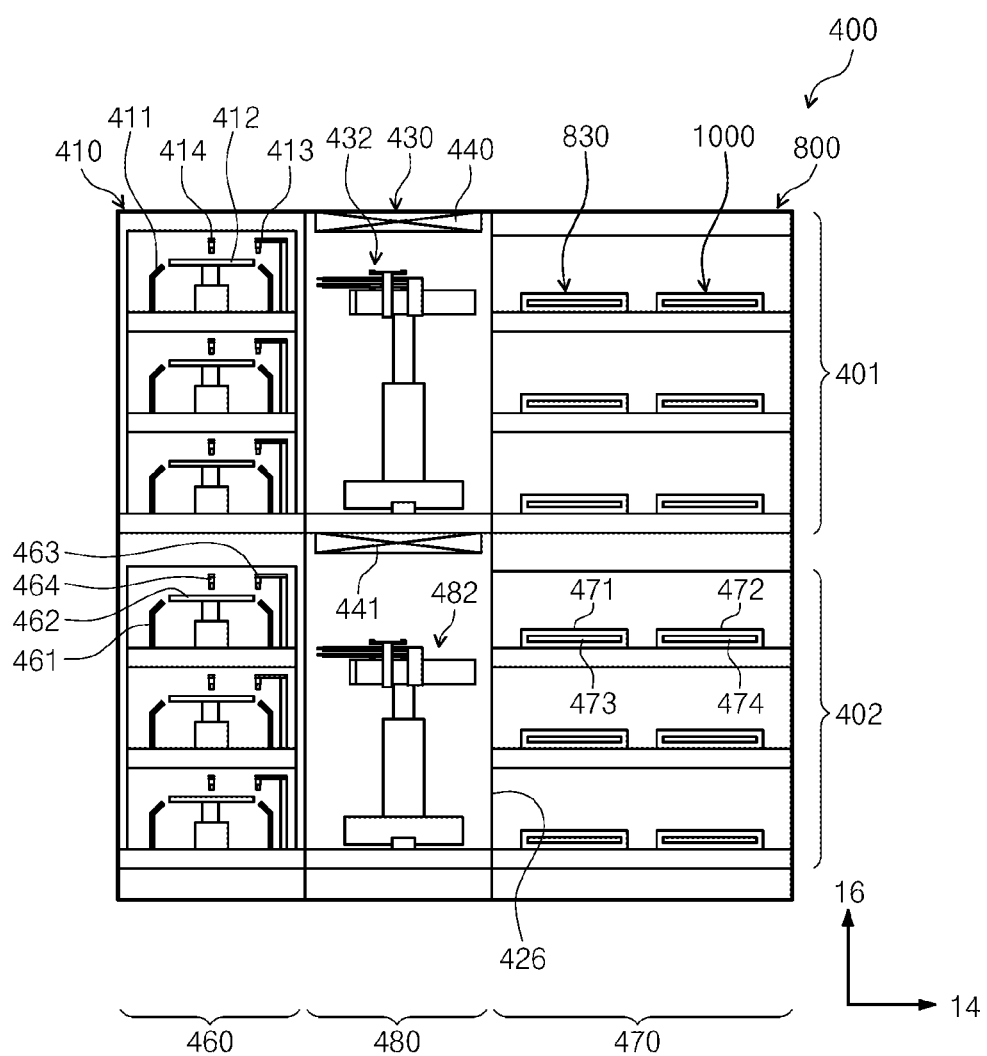
FIG. 3 is a view illustrating the equipment of FIG. 1 when viewed in direction B-B.
Figure 4:
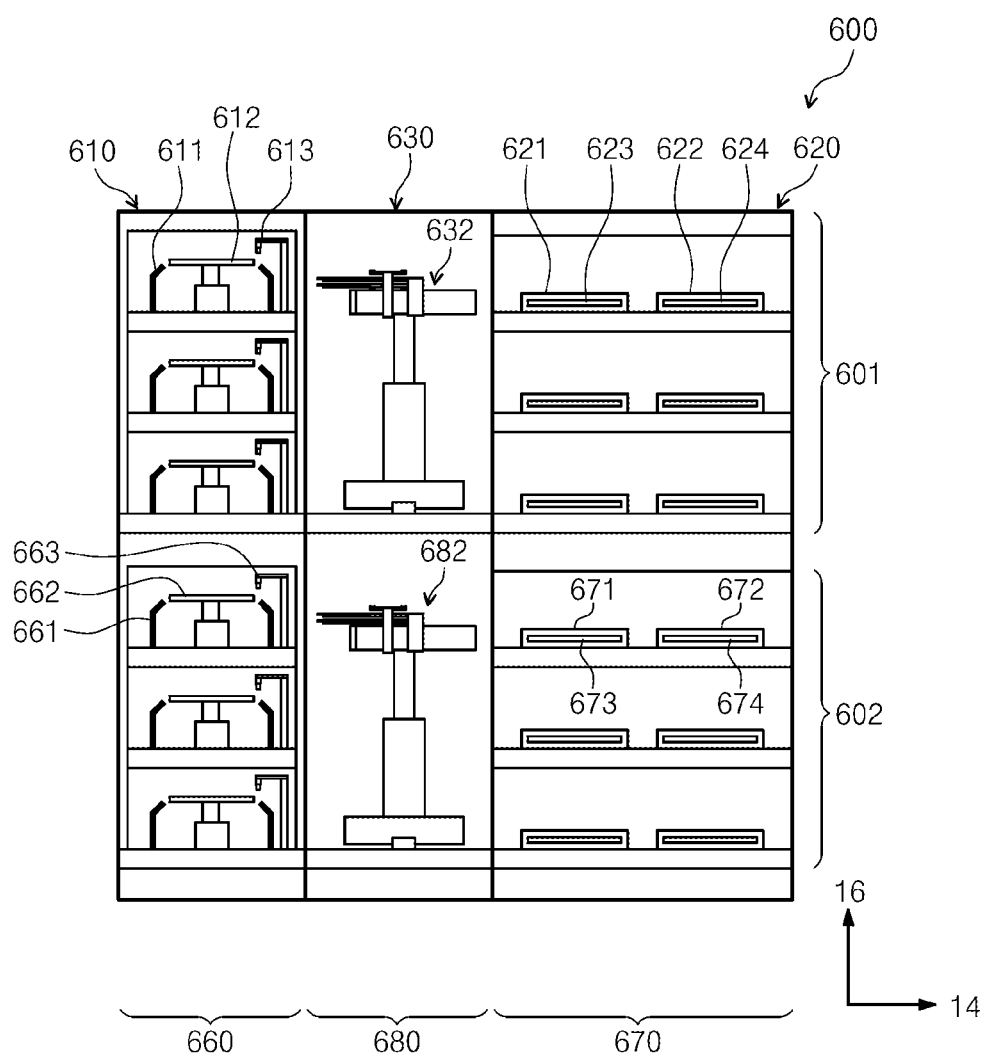
FIG. 4 is a view illustrating the equipment of FIG. 1 when viewed in direction C-C.

FIG. 1 is a schematic plan view illustrating substrate treating equipment according to an embodiment of the inventive concept. FIG. 2 is a view illustrating the equipment of FIG. 1 when viewed in direction A-A. FIG. 3 is a view illustrating the equipment of FIG. 1 when viewed in direction B-B. FIG. 4 is a view illustrating the equipment of FIG. 1 when viewed in direction C-C.

Referring to FIGS. 1 to 4, the substrate treating equipment 1 includes a load port 100, an index module 200, a first buffer module 300, a coating and developing module 400, a second buffer module 500, a pre/post-exposure treatment module 600, and an interface module 700. The load port 100, the index module 200, the first buffer module 300, the coating and developing module 400, the second buffer module 500, the pre/post-exposure treatment module 600, and the interface module 700 are sequentially disposed in a row in one direction.

Hereinafter, a direction in which the load port 100, the index module 200, the first buffer module 300, the coating and developing module 400, the second buffer module 500, the pre/post-exposure treatment module 600, and the interface module 700 are disposed is referred to as a first direction 12. A direction perpendicular to the first direction 12 when viewed from above is referred to as a second direction 14, and a direction perpendicular to the first direction 12 and the second direction 14 is referred to as a third direction 16.

Substrates W are moved in a state of being received in cassettes 20. The cassettes 20 have a structure that can be sealed from the outside. For example, front open unified pods (FOUPs), each of which has a door at the front, may be used as the cassettes 20.

Hereinafter, the load port 100, the index module 200, the first buffer module 300, the coating and developing module 400, the second buffer module 500, the pre/post-exposure treatment module 600, and the interface module 700 will be described in detail.

The load port 100 has a plurality of mounting tables 120 on which the cassettes 20 having the substrates W received therein are placed. The mounting tables 120 are disposed in a row along the second direction 14. In FIG. 2, four mounting tables 120 are provided.

The index module 200 transfers the substrates W between the cassettes 20 placed on the mounting tables 120 of the load port 100 and the first buffer module 300. The index module 200 has a frame 210, an index robot 220, and a guide rail 230. The frame 210 has a substantially rectangular parallelepiped shape with an empty space inside and is disposed between the load port 100 and the first buffer module 300. The frame 210 of the index module 200 may be provided in a lower position than a frame 310 of the first buffer module 300 that will be described below. The index robot 220 and the guide rail 230 are disposed in the frame 210. The index robot 220 has a structure capable of 4-axis driving such that a hand 221 for directly handling the substrates W is movable in the first direction 12, the second direction 14, and the third direction 16 and is rotatable about the central axis thereof.

The index robot 220 has the hand 221, an arm 222, a support rod 223, and a base 224. The hand 221 is fixedly attached to the arm 222. The arm 222 is provided in a retractable and rotatable structure. The support rod 223 is disposed such that the lengthwise direction thereof is parallel to the third direction 16. The arm 222 is coupled to the support rod 223 so as to be movable along the support rod 223. The support rod 223 is fixedly coupled to the base 224. The guide rail 230 is disposed such that the lengthwise direction thereof is parallel to the second direction 14. The base 224 is coupled to the guide rail 230 so as to be rectilinearly movable along the guide rail 230. Furthermore, although not illustrated, a door opener for opening and closing doors of the cassettes 20 is additionally provided in the frame 210.

The first buffer module 300 has the frame 310, a first buffer 320, a second buffer 330, a cooling chamber 350, and a first buffer robot 360. The frame 310 has a rectangular parallelepiped shape with an empty space inside and is disposed between the index module 200 and the coating and developing module 400. The first buffer 320, the second buffer 330, the cooling chamber 350, and the first buffer robot 360 are located in the frame 310. The cooling chamber 350, the second buffer 330, and the first buffer 320 are sequentially disposed upward along the third direction 16. The first buffer 320 is located at the height corresponding to a coating module 401 of the coating and developing module 400 that will be described below, and the second buffer 330 and the cooling chamber 350 are located at the height corresponding to a developing module 402 of the coating and developing module 400 that will be described below. The first buffer robot 360 is located to be spaced apart from the second buffer 330, the cooling chamber 350, and the first buffer 320 by a predetermined distance in the second direction 14.

The first buffer 320 and the second buffer 330 each temporarily store a plurality of substrates W. The second buffer 330 has a housing 331 and a plurality of supports 332. The supports 332 are disposed in the housing 331 and are spaced apart from each other along the third direction 16. One substrate W is placed on each of the supports 332.

The housing 331 has openings (not illustrated) that face the directions in which the index robot 220, the first buffer robot 360, and a developer robot 482 are provided, respectively, such that the index robot 220, the first buffer robot 360, and the developer robot 482 of the developing module 402, which will be described below, load the substrates W onto the supports 332 in the housing 331 or unload the substrates W from the supports 332 in the housing 331. The first buffer 320 has a structure substantially similar to that of the second buffer 330.

However, a housing 321 of the first buffer 320 has openings that face the directions in which the first buffer robot 360 and a coater robot 432 located in the coating module 401 are provided. The number of supports 332 provided in the first buffer 320 may be the same as, or different from, the number of supports 332 provided in the second buffer 330. According to an embodiment, the number of supports 332 provided in the second buffer 330 may be larger than the number of supports 322 provided in the first buffer 320.

The first buffer robot 360 transfers the substrate W between the first buffer 320 and the second buffer 330. The first buffer robot 360 has a hand 361, an arm 362, and a support rod 363. The hand 361 is fixedly attached to the arm 362. The arm 362 has a retractable structure and enables the hand 361 to move along the second direction 14. The arm 362 is coupled to the support rod 363 so as to be rectilinearly movable along the support rod 363 in the third direction 16. The support rod 363 has a length extending from the position corresponding to the second buffer 330 to the position corresponding to the first buffer 320. The support rod 363 may further extend upward or downward. The first buffer robot 360 may be provided such that the hand 361 simply performs only 2-axis driving along the second direction 14 and the third direction 16.

The cooling chamber 350 cools the substrate W. The cooling chamber 350 has a housing 351 and a cooling plate 352. The cooling plate 352 has an upper surface on which the substrate W is placed and a cooling means 353 that cools the substrate W. Various methods, such as cooling by cooling water, cooling by a thermoelectric element, and the like, may be used for the cooling means 353. Furthermore, the cooling chamber 350 may include a lift pin assembly (not illustrated) that locates the substrate W on the cooling plate 352. The housing 351 has openings (not illustrated) that face the directions in which the index robot 220 and the developer robot 482 are provided, respectively, such that the index robot 220 and the developer robot 482 provided in the developing module 402 load the substrate W onto the cooling plate 352 or unload the substrate W from the cooling plate 352. In addition, the cooling chamber 350 may include doors (not illustrated) that open and close the openings described above.

The coating and developing module 400 performs a process of coating the substrate W with photoresist before an exposing process and performs a developing process on the substrate W after the exposing process. The coating and developing module 400 has a substantially rectangular parallelepiped shape. The coating and developing module 400 has the coating module 401 and the developing module 402. The coating module 401 and the developing module 402 are disposed on different floors so as to be divided from each other. According to an embodiment, the coating module 401 is located over the developing module 402.

The coating module 401 performs a process of coating the substrate W with a photosensitive liquid such as photoresist and performs a heat treatment process, such as heating or cooling, on the substrate W before and after the resist coating process. The coating module 401 has resist coating units 410, bake units 800, and a transfer chamber 430. The resist coating units 410, the transfer chamber 430, and the bake units 800 are sequentially disposed along the second direction 14.

Accordingly, the resist coating units 410 and the bake units 800 are spaced apart from each other in the second direction 14, with the transfer chamber 430 therebetween. The resist coating units 410 are arranged in the first direction 12 and the third direction 16. The drawings illustrate an example that six resist coating units 410 are provided. The bake units 800 are arranged in the first direction 12 and the third direction 16. The drawings illustrate an example that six bake units 800 are provided. However, a larger or smaller number of bake units 800 may be provided.

The transfer chamber 430 is located side by side with the first buffer 320 of the first buffer module 300 in the first direction 12. The coater robot 432 is located in the transfer chamber 430. The transfer chamber 430 has a substantially rectangular shape. A fan filter unit 440 for generating a vertical air flow may be provided in the transfer chamber 430. The fan filter unit 440 generates a vertical air flow from the top toward the bottom of a housing 425 and blows clean air into the transfer chamber 430.

The coater robot 432 transfers the substrate W between the bake units 800, the resist coating units 400, the first buffer 320 of the first buffer module 300, and a first cooling chamber 530 of the second buffer module 500 that will be described below.

Figure 5:
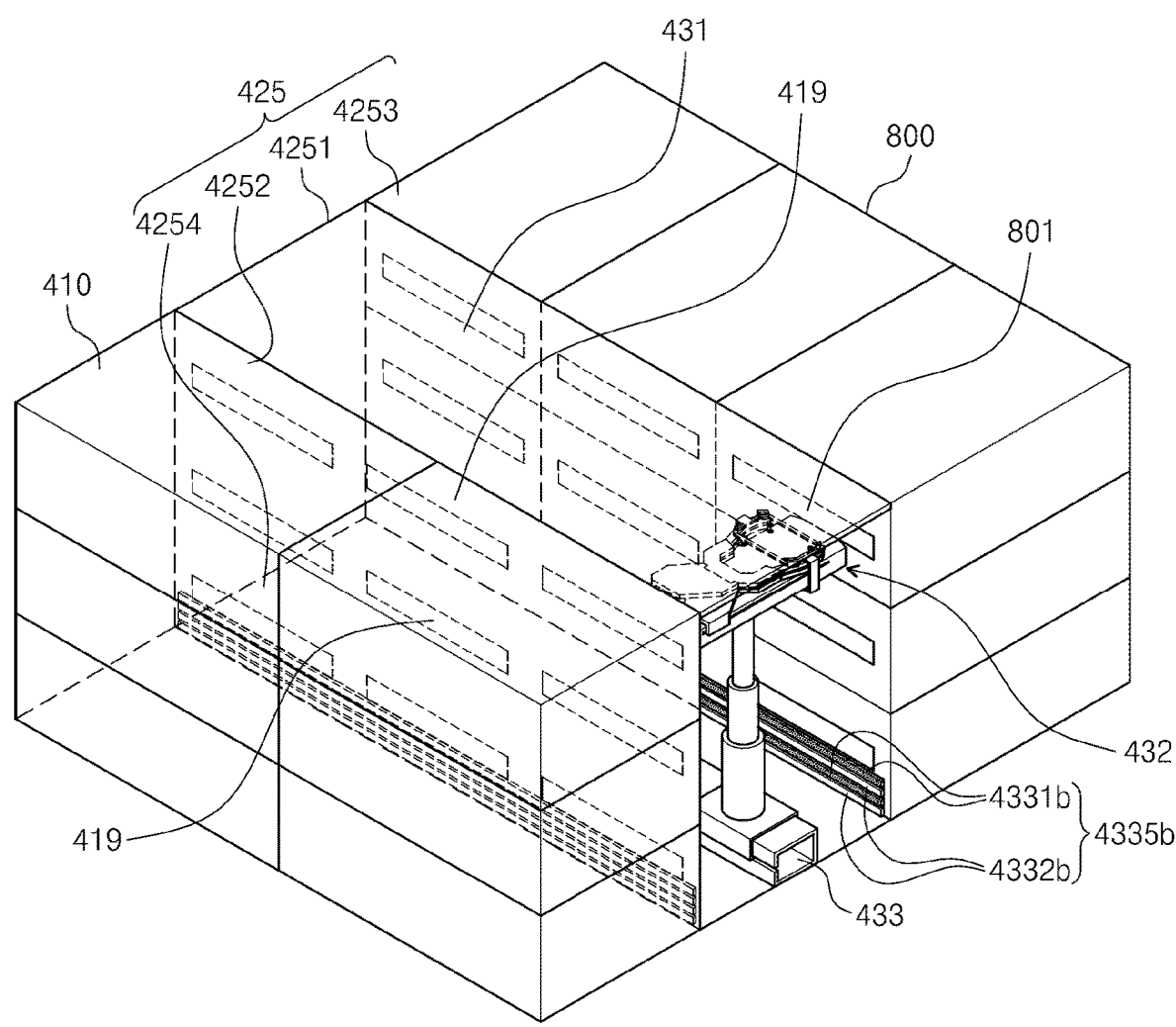
FIGS. 5 and 6 are a perspective view and a side view schematically illustrating one embodiment of a transfer chamber of FIG. 1.
Figure 6:
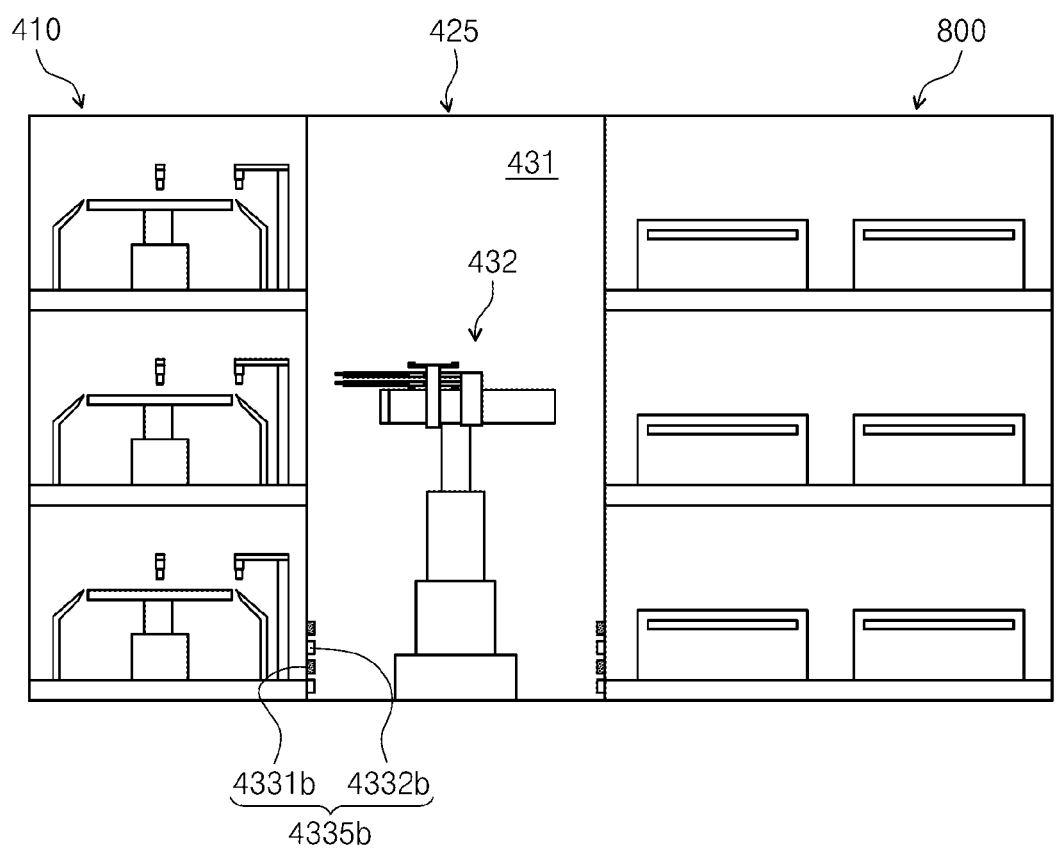

FIGS. 5 and 6 are a perspective view and a side view schematically illustrating one embodiment of the transfer chamber 430 of FIG. 1. Referring to FIGS. 5 and 6, the transfer chamber 433 includes the housing 425, the transfer robot 432, an electrostatic pad 4335, and a drive unit 433. The housing 425 has a transfer space 431 in which the substrate W is transferred.

The housing 425 has an upper wall 4251, a lower wall 4254, and inner walls 4252 and 4253. In an embodiment, the inner wall 4252 on one side of the housing 425 is implemented with outer walls of the resist coating units 410 in which substrate entrance/exit openings 419 are formed. The inner wall 4253 on an opposite side of the housing 425 is implemented with outer walls of the bake units 800 in which substrate entrance/exit openings 801 are formed.

The transfer robot 432 is disposed in the transfer space 431 and transfers the substrate W between the treatment modules as described above. The electrostatic pad 4335 is provided in the transfer space 431 and electro-statically attracts particles in the housing 425. The drive unit 433 moves the transfer robot 432.

Electrostatic pads 4335*b* are attached to the inner walls 4252 and 4253 of the housing 425. The inner walls 4252 and 4253 are parallel to a direction of movement of the transfer robot 432. In an embodiment, the electrostatic pads 4335*b* may be provided on both the inner walls 4252 and 4253.

According to an embodiment, the electrostatic pads 4335*b* may be disposed at a height corresponding to, or close to, the drive unit 433 that drives the transfer robot 432. For example, in the housing 425, the electrostatic pads 4335*b* may be provided below the lowermost entrance/exit openings 419 and 801 among the entrance/exit openings 419 and 801 provided to load the substrates W into the chambers or unload the substrates W from the chambers.

According to an embodiment, the electrostatic pads 4335*b* may include a first pad 4331*b* and a second pad 4332*b*. The first pad 4331*b* is formed of a material that attracts positively charged particles. The second pad 4332*b* is formed of a material that attracts negatively charged particles. A plurality of first pads 4331*b* and a plurality of second pads 4332*b* are provided. Although two first pads 4331*b* and two second pads 4332*b* are illustrated as being provided on each sidewall, a larger or smaller number of first pads 4331 and second pads 4332 may be provided. In an embodiment, the first pads 4331*b* and the second pads 4332*b* are alternately disposed.

The first pads 4331*b* are formed of a material that is easy to electrify with a negative charge. In an embodiment, the first pads 4331*b* may contain one of Teflon, silicone, polyethylene, and vinyl chloride. The second pads 4332*b* are formed of a material that is easy to electrify with a positive charge. In an embodiment, the second pads 4331*b* may contain one of nylon, acetate, and aluminum.

Figure 7:
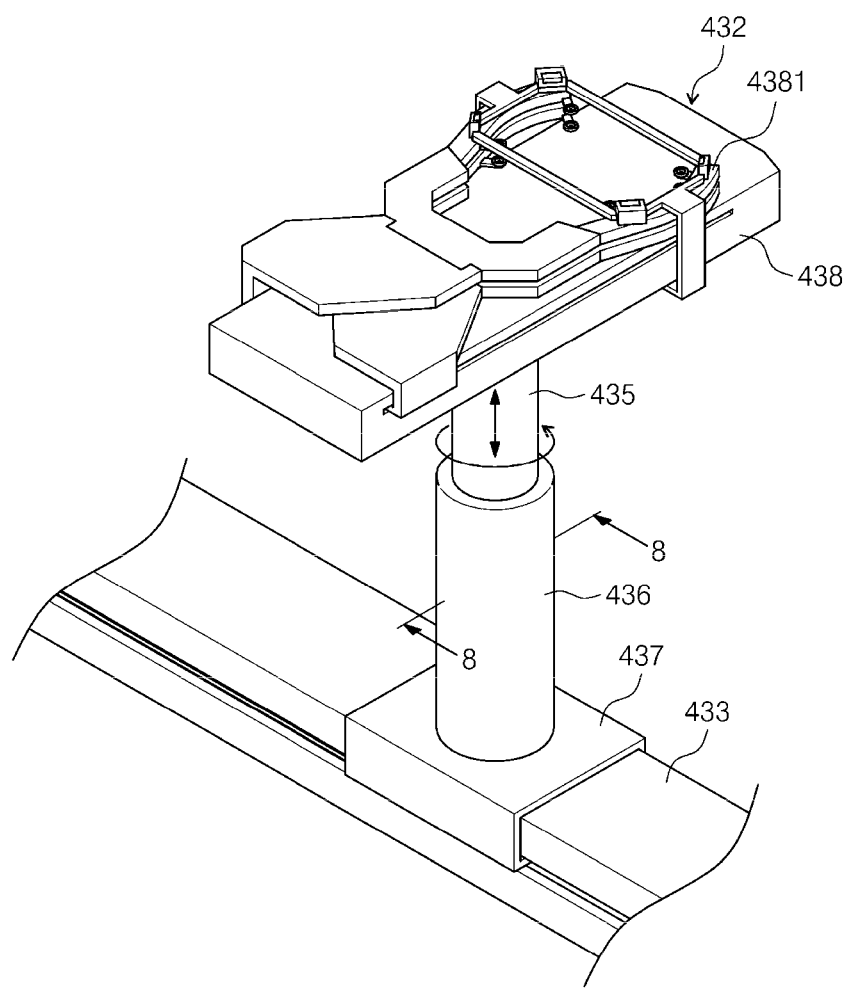
FIG. 7 is a view illustrating a transfer robot according to an embodiment of the inventive concept.

FIG. 7 is a view illustrating the transfer robot 432 according to an embodiment of the inventive concept. Referring to FIG. 7, the transfer robot 432 may include a plurality of hands 4381, a hand drive unit 438, a rotary part 435, a vertical movement part 436, and a horizontal movement part 437.

The hands 4381 may be disposed to face each other. Each of the hands 4381 may be loaded with one substrate W. Although FIG. 7 illustrates an example that two hands 4381 are provided, the number of hands 4381 may be increased depending on process efficiency. The hand drive unit 438 moves the hands 4381 in the horizontal direction. The hand drive unit 438 may individually move the hands 4381. The rotary part 435 is located under the hand drive unit 438 and supports the hand drive unit 438. The rotary part 435 rotates the hand drive unit 438, and the hands 4381 are rotated together with the hand drive unit 438.

The vertical movement part 436 is coupled with the rotary part 435 and vertically moves the rotary part 435. Accordingly, the hand drive unit 438 and the hands 4381 are moved in the vertical direction, and the heights of the hand drive unit 438 and the hands 4381 are adjusted. The horizontal movement part 437 is coupled to a lower end of the vertical movement part 436 and rectilinearly moves along the rail-shaped drive unit 433 in the horizontal direction.

Figure 8:
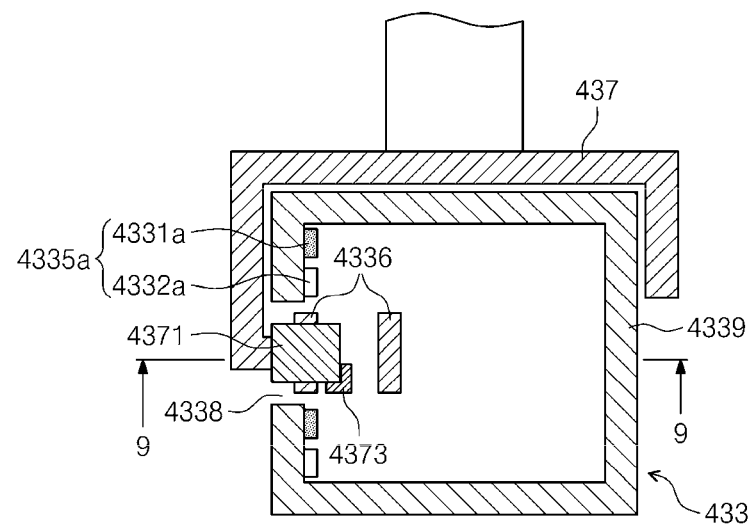
FIG. 8 is a side sectional view illustrating another embodiment of a drive unit of the inventive concept.
Figure 9:
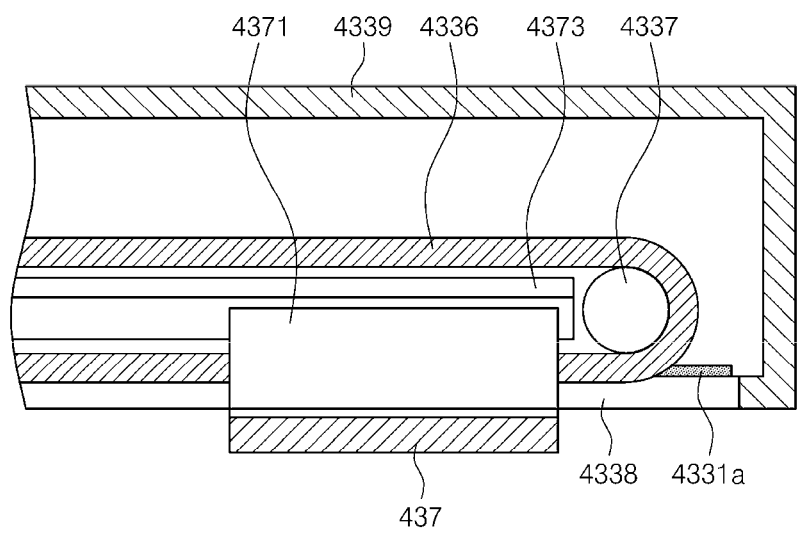
FIG. 9 is a horizontal sectional view illustrating the other embodiment of the drive unit of the inventive concept.

FIGS. 8 and 9 are sectional views illustrating another embodiment of the drive unit 433 of the inventive concept. Referring to FIGS. 8 and 9, a drive unit 433 may have a structure similar to that of the drive unit 433 of FIG. 7. However, the drive unit 433 of FIGS. 8 and 9 has an electrostatic pad 4335*a* therein.

Referring to FIGS. 8 and 9, the drive unit 433 includes a main body 4339, a sealing belt 4336, a guide rail 4373, rollers 4337, and an actuator (not illustrated).

An opening 4338 is formed in the main body 4339. The sealing belt 4336 is located to face the opening 4338 and seals the opening 4338. A bracket 4371 coupled with the transfer robot 432 is coupled to the sealing belt 4336. The bracket 4371 is moved along the guide rail 4373 in the horizontal direction. The sealing belt 4336 is moved like a conveyor belt by the rollers 4337 and moves the transfer robot 432 in the horizontal direction by moving the bracket 4371 coupled to the sealing belt 4336. The actuator (not illustrated) is disposed in the main body 4339 and moves the sealing belt 4336. In an embodiment, the actuator (not illustrated) may be a motor that provides power to the rollers 4337.

The electrostatic pad 4335*a* is located in the main body 4339 so as to be adjacent to the opening 4338. In an embodiment, the electrostatic pad 4335*a* is attached to an inner sidewall of the main body 4339 that is adjacent to the opening 4338. The electrostatic pad 4335*a* may include a first pad 4331*a* and a second pad 4332*a*. The first pad 4331*a* is formed of a material that attracts positively charged particles. The second pad 4332*a* is formed of a material that attracts negatively charged particles. A plurality of first pads 4331*a* and a plurality of second pads 4332*a* are provided. Although FIG. 8 illustrates an example that two first pads 4331*a* and two second pads 4332*a* are provided, a larger or smaller number of first pads 4331*a* and second pads 4332*a* may be provided. In an embodiment, the first pads 4331*a* and the second pads 4332*a* are alternately disposed.

Although it has been described that the transfer robot 432 transfers a wafer in a substrate treating apparatus that performs coating and developing processes, the transfer robot 432 may be provided in apparatuses that perform various processes. For example, the transfer robot 432 may transfer wafers in a substrate cleaning apparatus that performs a cleaning process on the wafers.

Figure 10:
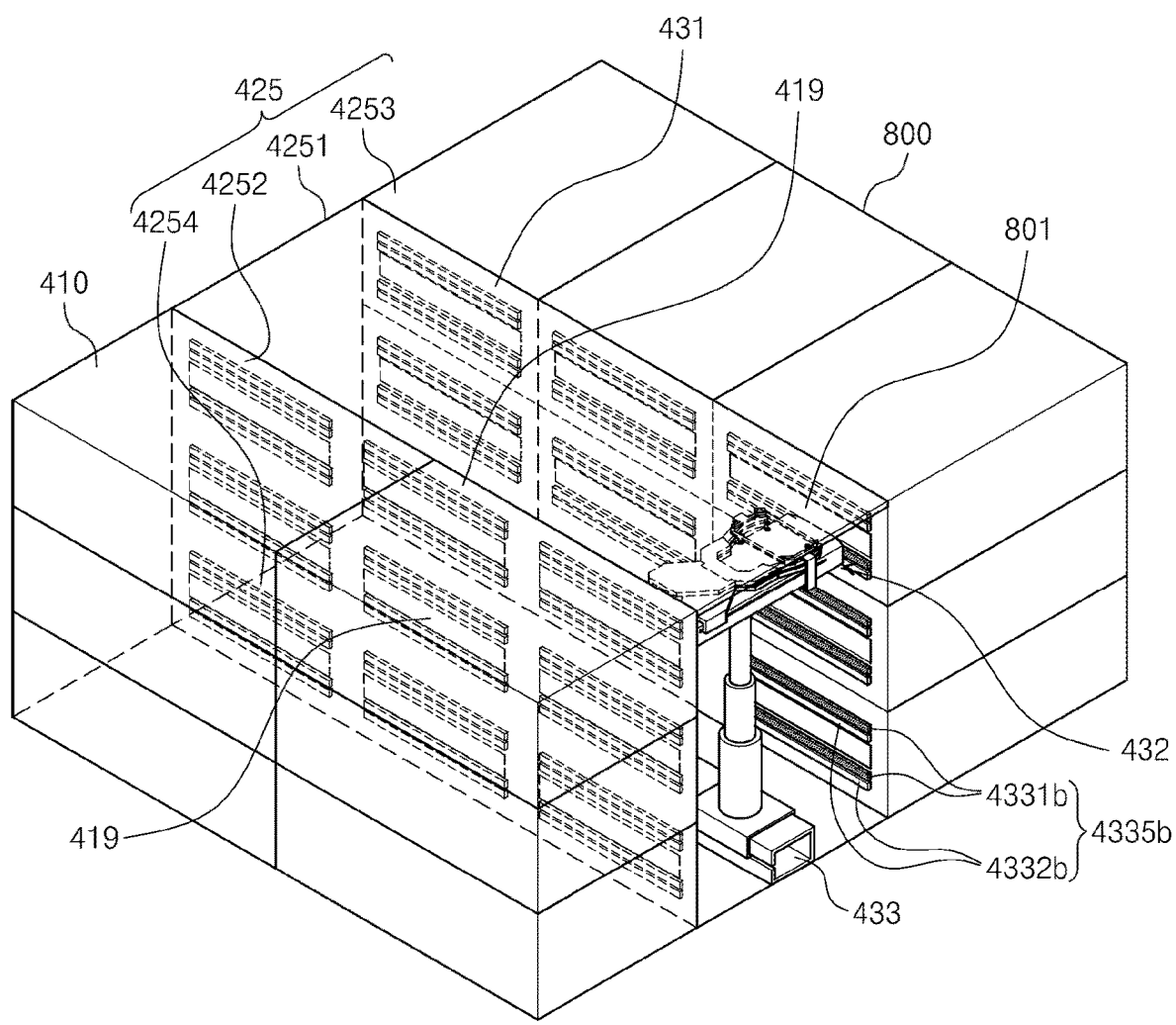
FIGS. 10 and 11 are schematic views illustrating other embodiments of an electrostatic pad provided in a housing of the transfer chamber of the inventive concept.
Figure 11:
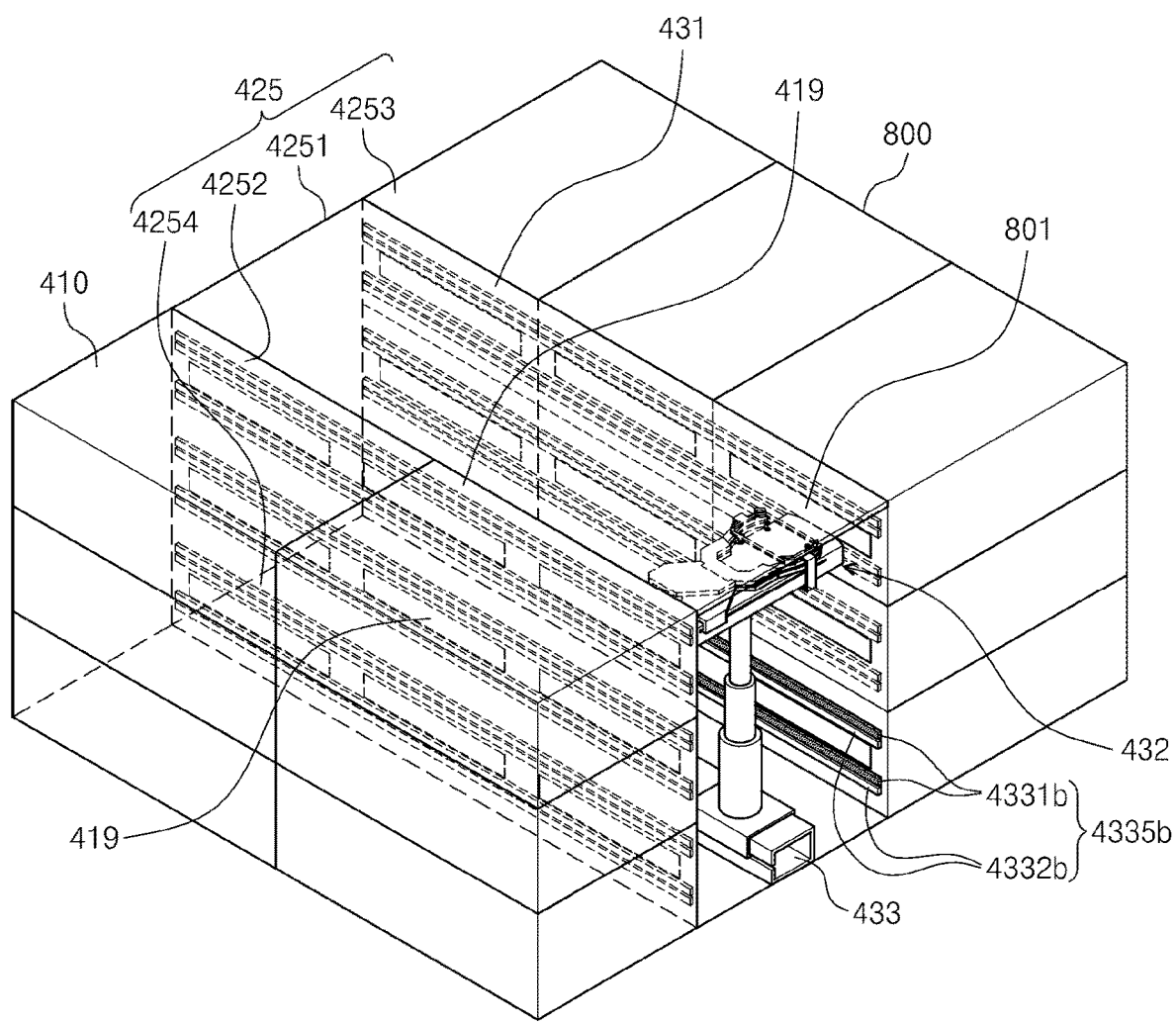

Hereinabove, the electrostatic pads 4335*b* attached to the inner walls 4252 and 4253 of the housing 425 have been described as being provided below the lowermost entrance/exit openings 419 and 801 among the entrance/exit openings 419 and 801 provided to load the substrates W into the chambers. However, the electrostatic pads 4335*b* may be provided at various heights in the housing 425. For example, as illustrated in FIGS. 10 and 11, the electrostatic pads 4335*b* may be disposed to fill the remaining space other than the entrance/exit openings 419 and 801 provided to load the substrates W into the chambers.

Selectively, the electrostatic pads 4335*b* may be disposed on at least one of an area below the lowermost entrance/exit openings 419 and 801 among the entrance/exit openings 419 and 801 provided to load the substrates W into the chambers, an area between the entrance/exit openings 419 and 801 adjacent to each other, areas corresponding to the entrance/exit openings 419 and 801, and an area above the uppermost entrance/exit openings 419 and 801.

The electrostatic pads 4335*b* have been described as having a length corresponding to the lengthwise direction of the housing 425. However, a plurality of electrostatic pads 4335*b* may be provided to be spaced apart from each other along the lengthwise direction of the housing 425. For example, as illustrated in FIG. 10, three electrostatic pads 4335*b* may be provided to be spaced apart from each other along the lengthwise direction of the housing 425.

The electrostatic pad 4335 has been described as being provided in the transfer chamber 430. However, in another embodiment, the electrostatic pad 4335 may be applied to all chambers in which particles are likely to be generated.

The electrostatic pad 4335 has been described as including all of the first pads 4331 and the second pads 4332. However, in another embodiment, the electrostatic pad 4335 may include only one of the first pads 4331 and the second pads 4332. In an embodiment, only the first pads 4331 may be provided in an environment in which negatively charged particles are mainly generated. In an embodiment, only the second pads 4332 may be provided in an environment in which positively charged particles are mainly generated.

The electrostatic pad 4335 has been described as being provided in the housing 425 or the drive unit 433. However, in another embodiment, the electrostatic pad 4335 may be provided in both the housing 425 and the drive unit 433.

According to the inventive concept, the electrostatic pad attracts particles not removed by the fan filter unit, thereby preventing the particles from escaping from the transfer chamber 430.

According to the inventive concept, the transfer robot 432, while moving, attracts particles generated due to friction with the sealing belt 4336, thereby preventing the particles from escaping from the transfer chamber 430.

According to the inventive concept, the electrostatic pad 4335 has an advantage of removing both negatively charged particles and positively charged particles.

According to the inventive concept, the first pads 4331 and the second pads 4332 are alternately provided. Accordingly, negatively charged particles and positively charged particles are evenly removed in a wide area of the electrostatic pad 4335.

Referring again to FIGS. 1 to 4, the resist coating units 410 all have the same structure. However, the types of photosensitive liquids used in the respective resist coating units 410 may differ from one another. For example, chemical amplification resist may be used as a photosensitive liquid. Each of the resist coating units 410 coats the substrate W with a photosensitive liquid. The resist coating unit 410 has a housing 411, a support plate 412, and a nozzle 413. The housing 411 has a cup shape with an open top. The support plate 412 is located in the housing 411 and supports the substrate W. The support plate 412 is provided so as to be rotatable.

The nozzle 413 dispenses the photosensitive liquid onto the substrate W placed on the support plate 412. Additionally, the resist coating unit 410 may further include a nozzle 414 that dispenses a cleaning solution, such as deionized water, to clean the surface of the substrate W that is coated with the photosensitive liquid.

Although not illustrated in the drawings, an electrostatic pad may be provided in a transfer chamber 480 as in the transfer chamber 430 provided in the coating module 401.

Each of the bake units 800 performs heat treatment on the substrate W. The bake unit 800 includes a cooling plate 830 and a heating unit 1000. The cooling plate 830 may cool the substrate W heated by the heating unit 1000. The cooling plate 830 has a circular plate shape. A cooling means, such as cooling water or a thermoelectric element, is provided inside the cooling plate 830. For example, the substrate W placed on the cooling plate 830 may be cooled to a temperature that is the same as, or close to, the room temperature.

The heating unit 1000 is implemented with a substrate treating apparatus that heats the substrate W. The heating unit 1000 heats the substrate W in an atmospheric atmosphere or in an atmosphere of reduced pressure lower than the atmospheric pressure.

The developing module 402 performs a developing process of removing part of photoresist by supplying a developing solution to obtain patterns on the substrate W and a heat treatment process of heating and cooling the substrate W before or after the developing process. The developing module 402 has developing units 460, bake units 470, and a transfer chamber 480. The developing units 460, the transfer chamber 480, and the bake units 470 are sequentially disposed along the second direction 14. Accordingly, the developing units 460 and the bake units 470 are spaced apart from each other in the second direction 14, with the transfer chamber 480 therebetween. The developing units 460 are arranged in the first direction 12 and the third direction 16. The drawings illustrate an example that six developing units 460 are provided. The bake units 470 are arranged in the first direction 12 and the third direction 16. The drawings illustrate an example that six bake units 470 are provided. However, a larger number of bake units 470 may be provided.

The transfer chamber 480 is located side by side with the second buffer 330 of the first buffer module 300 in the first direction 12. The developer robot 482 is located in the transfer chamber 480. The transfer chamber 480 has a substantially rectangular shape. A fan filter unit 441 for generating a vertical air flow may be provided in the transfer chamber 480. The fan filter unit 441 generates a vertical air flow from the top toward the bottom of a housing 426 and blows clean air into the transfer chamber 480. The developer robot 482 transfers the substrate W between the bake units 470, the developing units 460, the second buffer 330 and the cooling chamber 350 of the first buffer module 300, and a second cooling chamber 540 of the second buffer module 500.

The developing units 460 all have the same structure. However, the types of developing solutions used in the respective developing units 460 may differ from one another. Each of the developing units 460 removes light-exposed regions of the photoresist on the substrate W. At this time, light-exposed regions of a protective film are also removed. Selectively, depending on the type of photoresist used, only masked regions of the photoresist and the protective film may be removed.

The developing unit 460 has a housing 461, a support plate 462, and a nozzle 463. The housing 461 has a cup shape with an open top. The support plate 462 is located in the housing 461 and supports the substrate W. The support plate 462 is provided so as to be rotatable. The nozzle 463 dispenses a developing solution onto the substrate W placed on the support plate 462. The nozzle 463 may have a circular tubular shape and may dispense the developing solution onto the center of the substrate W. Selectively, the nozzle 463 may have a length corresponding to the diameter of the substrate W, and a dispensing opening of the nozzle 463 may have a slit shape. Additionally, the developing unit 460 may further include a nozzle 464 that dispenses a cleaning solution such as deionized water to clean the surface of the substrate W onto which the developing solution is dispensed.

The bake units 470 of the developing module 402 perform heat treatment on the substrate W. For example, the bake units 470 perform a post bake process of heating the substrate W before the developing process, a hard bake process of heating the substrate W after the developing process, and a cooling process of cooling the substrate W after the bake processes. Each of the bake units 470 has a cooling plate 471 or a heating unit 472. A cooling means 473, such as cooling water or a thermoelectric element, is provided inside the cooling plate 471. Alternatively, a heating means 474, such as a heating wire or a thermoelectric element, is provided inside the heating unit 472. The cooling plate 471 and the heating unit 472 may be provided in one bake unit 470. Selectively, some of the bake units 470 may include only the cooling plate 471, and the other bake units 470 may include only the heating unit 472. The bake units 470 of the developing module 402 have the same configuration as the bake units 800 of the coating module 401, and therefore detailed description thereabout will be omitted.

The second buffer module 500 serves as a passage through which the substrate W is carried between the coating and developing module 400 and the pre/post-exposure treatment module 600. In addition, the second buffer module 500 performs a predetermined process, such as a cooling process or an edge exposing process, on the substrate W. The second buffer module 500 has a frame 510, a buffer 520, a first cooling chamber 530, a second cooling chamber 540, an edge exposing chamber 550, and a second buffer robot 560. The chamber 510 has a rectangular parallelepiped shape. The buffer 520, the first cooling chamber 530, the second cooling chamber 540, the edge exposing chamber 550, and the second buffer robot 560 are located in the frame 510. The buffer 520, the first cooling chamber 530, and the edge exposing chamber 550 are disposed at the height corresponding to the coating module 401. The second cooling chamber 540 is disposed at the height corresponding to the developing module 402. The buffer 520, the first cooling chamber 530, and the second cooling chamber 540 are sequentially disposed in a row along the third direction 16. When viewed from above, the buffer 520 is disposed side by side with the transfer chamber 430 of the coating module 401 along the first direction 12. The edge exposing chamber 550 is disposed to be spaced apart from the buffer 520 or the first cooling chamber 530 by a predetermined distance in the second direction 14.

The second buffer robot 560 carries the substrate W between the buffer 520, the first cooling chamber 530, and the edge exposing chamber 550. The second buffer robot 560 is located between the edge exposing chamber 550 and the buffer 520. The second buffer robot 560 may have a structure similar to that of the first buffer robot 360. The first cooling chamber 530 and the edge exposing chamber 550 perform subsequent processes on the substrate W treated in the coating module 401. The first cooling chamber 530 cools the substrate W treated in the coating module 401. The first cooling chamber 530 has a structure similar to that of the cooling chamber 350 of the first buffer module 300. The edge exposing chamber 550 performs an edge exposing process on the substrate W subjected to the cooling process in the first cooling chamber 530. The buffer 520 temporarily stores the substrate W before the substrate W treated in the edge exposing chamber 550 is transferred to a pre-treatment module 601 that will be described below. The second cooling chamber 540 cools the substrate W before the substrate W treated in a post-treatment module 602, which will be described below, is transferred to the developing module 402. The second buffer module 500 may further include an additional buffer at the height corresponding to the developing module 402. In this case, the substrate W treated in the post-treatment module 602 may be transferred to the developing module 402 after temporarily stored in the additional buffer.

In a case where a stepper 900 performs a liquid immersion lithography process, the pre/post-exposure treatment module 600 may perform a process of coating the substrate W with a protective film that protects the photoresist film on the substrate W during the liquid immersion lithography process. Furthermore, the pre/post-exposure treatment module 600 may perform a process of cleaning the substrate W after an exposing process. In addition, in a case where a coating process is performed using chemical amplification resist, the pre/post-exposure treatment module 600 may perform a post-exposure bake process.

The pre/post-exposure treatment module 600 has the pre-treatment module 601 and the post-treatment module 602. The pre-treatment module 601 performs a process of treating the substrate W before the exposing process, and the post-treatment module 602 performs a process of treating the substrate W after the exposing process. The pre-treatment module 601 and the post-treatment module 602 are disposed on different floors so as to be divided from each other. According to an embodiment, the pre-treatment module 601 is located over the post-treatment module 602. The pre-treatment module 601 is located at the same height as the coating module 401. The post-treatment module 602 is located at the same height as the developing module 402. The pre-treatment module 601 has protective-film coating units 610, bake units 620, and a transfer chamber 630. The protective-film coating units 610, the transfer chamber 630, and the bake units 620 are sequentially disposed along the second direction 14. Accordingly, the protective-film coating units 610 and the bake units 620 are spaced apart from each other in the second direction 14, with the transfer chamber 630 therebetween. The protective-film coating units 610 are vertically arranged along the third direction 16. Selectively, the protective-film coating units 610 may be arranged in the first direction 12 and the third direction 16. The bake units 620 are vertically arranged along the third direction 16. Selectively, the bake units 620 may be arranged in the first direction 12 and the third direction 16.

The transfer chamber 630 is located side by side with the first cooling chamber 530 of the second buffer module 500 in the first direction 12. A pre-treatment robot 632 is located in the transfer chamber 630. The transfer chamber 630 has a substantially square or rectangular shape. The pre-treatment robot 632 transfers the substrate W between the protective-film coating units 610, the bake units 620, the buffer 520 of the second buffer module 500, and a first buffer 720 of the interface module 700 that will be described below.

Each of the protective-film coating units 610 coats the substrate W with a protective film that protects a resist film during liquid immersion lithography. The protective-film coating unit 610 has a housing 611, a support plate 612, and a nozzle 613. The housing 611 has a cup shape with an open top. The support plate 612 is located in the housing 611 and supports the substrate W. The support plate 612 is provided so as to be rotatable. The nozzle 613 dispenses a protective liquid for forming a protective film onto the substrate W placed on the support plate 612. The nozzle 613 may have a circular tubular shape and may dispense the protective liquid onto the center of the substrate W. Selectively, the nozzle 613 may have a length corresponding to the diameter of the substrate W, and a dispensing opening of the nozzle 613 may have a slit shape. In this case, the support plate 612 may be provided in a fixed state. The protective liquid contains a foam material. A material having a low affinity with photoresist and water may be used as the protective liquid. For example, the protective liquid may include a fluorine-based solvent. The protective-film coating unit 610 dispenses the protective liquid onto the central region of the substrate W while rotating the substrate W placed on the support plate 612.

Each of the bake units 620 performs heat treatment on the substrate W coated with the protective film. The bake unit 620 has a cooling plate 621 or a heating plate 622. A cooling means 623, such as cooling water or a thermoelectric element, is provided inside the cooling plate 621. Alternatively, a heating means 624, such as a heating wire or a thermoelectric element, is provided inside the heating plate 622. The heating plate 622 and the cooling plate 621 may be provided in one bake unit 620. Selectively, some of the bake units 620 may include only the heating plate 622, and the other bake units 620 may include only the cooling plate 621.

The post-treatment module 602 has cleaning chambers 660, post-exposure bake units 670, and a transfer chamber 680. The cleaning chambers 660, the transfer chamber 680, and the post-exposure bake units 670 are sequentially disposed along the second direction 14. Accordingly, the cleaning chambers 660 and the post-exposure bake units 670 are spaced apart from each other in the second direction 14, with the transfer chamber 680 therebetween. The cleaning chambers 660 may be vertically arranged along the third direction 16. Selectively, the cleaning chambers 660 may be arranged in the first direction 12 and the third direction 16. The post-exposure bake units 670 may be vertically arranged along the third direction 16. Selectively, the post-exposure bake units 670 may be arranged in the first direction 12 and the third direction 16.

The transfer chamber 680, when viewed from above, is located side by side with the second cooling chamber 540 of the second buffer module 500 in the first direction 12. The transfer chamber 680 has a substantially square or rectangular shape. A post-treatment robot 682 is located in the transfer chamber 680. The post-treatment robot 682 transfers the substrate W between the cleaning chambers 660, the post-exposure bake units 670, the second cooling chamber 540 of the second buffer module 500, and a second buffer 730 of the interface module 700 that will be described below. The post-treatment robot 682 provided in the post-treatment module 602 may have the same structure as the pre-treatment robot 632 provided in the pre-treatment module 601.

Each of the cleaning chambers 660 performs a cleaning process on the substrate W after the exposing process. The cleaning chamber 660 has a housing 661, a support plate 662, and a nozzle 663. The housing 661 has a cup shape with an open top. The support plate 662 is located in the housing 661 and supports the substrate W. The support plate 662 is provided so as to be rotatable. The nozzle 663 dispenses a cleaning solution onto the substrate W placed on the support plate 662. Water such as deionized water may be used as the cleaning solution. The cleaning chamber 660 dispenses the cleaning solution onto the central region of the substrate W while rotating the substrate W placed on the support plate 662. Selectively, while the substrate W is rotated, the nozzle 663 may rectilinearly move or swing from the central region of the substrate W to the edge region thereof.

Each of the post-exposure bake units 670 heats the substrate W, which is subjected to the exposing process, by using far ultraviolet rays. A post-exposure bake process heats the substrate W to amplify acid generated in the photoresist by the exposing process, thereby completing a change in the property of the photoresist. The post-exposure bake unit 670 has a heating plate 672. A heating means 674, such as a heating wire or a thermoelectric element, is provided inside the heating plate 672. The post-exposure bake unit 670 may further include a cooling plate 671 therein. A cooling means 673, such as cooling water or a thermoelectric element, is provided inside the cooling plate 671. Selectively, a bake unit having only the cooling plate 671 may be additionally provided.

As described above, the pre-treatment module 601 and the post-treatment module 602 are completely separated from each other in the pre/post-exposure treatment module 600. Furthermore, the transfer chamber 630 of the pre-treatment module 601 and the transfer chamber 680 of the post-treatment module 602 may have the same size and may completely cover each other when viewed from above. Moreover, the protective-film coating unit 610 and the cleaning chamber 660 may have the same size and may completely cover each other when viewed from above. In addition, the bake unit 620 and the post-exposure bake unit 670 may have the same size and may completely cover each other when viewed from above.

The interface module 700 transfers the substrate W between the pre/post-exposure treatment module 600 and the stepper 900. The interface module 700 has a frame 710, the first buffer 720, the second buffer 730, and an interface robot 740. The first buffer 720, the second buffer 730, and the interface robot 740 are located in the frame 710. The first buffer 720 and the second buffer 730 are vertically spaced apart from each other by a predetermined distance. The first buffer 720 is disposed in a higher position than the second buffer 730. The first buffer 720 is located at the height corresponding to the pre-treatment module 601, and the second buffer 730 is disposed at the height corresponding to the post-treatment module 602. When viewed from above, the first buffer 720 is disposed in a row along the first direction 12 together with the transfer chamber 630 of the pre-treatment module 601, and the second buffer 730 is disposed in a row along the first direction 12 together with the transfer chamber 680 of the post-treatment module 602.

The interface robot 740 is located to be spaced apart from the first buffer 720 and the second buffer 730 in the second direction 14. The interface robot 740 transfers the substrate W between the first buffer 720, the second buffer 730, and the stepper 900. The interface robot 740 has a structure substantially similar to that of the second buffer robot 560.

The first buffer 720 temporarily stores the substrate W before the substrate W treated in the pre-treatment module 601 is moved to the stepper 900. The second buffer 730 temporarily stores the substrate W before the substrate W treated in the stepper 900 is moved to the post-treatment module 602. The first buffer 720 has a housing 721 and a plurality of supports 722. The supports 722 are disposed in the housing 721 and are spaced apart from each other along the third direction 16. One substrate W is placed on each of the supports 722. The housing 721 has openings (not illustrated) that face the directions in which the interface robot 740 and the pre-treatment robot 632 are provided, respectively, such that the interface robot 740 and the pre-treatment robot 632 load the substrates W onto the supports 722 in the housing 721 or unload the substrates W from the supports 722 in the housing 721. The second buffer 730 has a structure substantially similar to that of the first buffer 720. However, the housing of the second buffer 730 has no opening in the direction in which the interface robot 740 and the post-treatment robot 682 are provided. The interface module 700 may include only the buffers and the robot as described above, without including a chamber for performing a predetermined process on a substrate.

As described above, according to the embodiments, the inventive concept may minimize a poor process caused by particles generated in a process of transferring a substrate.

In addition, the inventive concept may minimize the release of particles generated in the transfer unit to the outside.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
    an index module; and
    a treatment chamber,
    wherein the index module includes:
        a load port on which a carrier having a plurality of substrates received therein is loaded; and
        a transfer frame disposed between the treatment chamber and the load port and configured to transfer the substrate between the carrier loaded on the load port and the treatment chamber,
    wherein the treatment chamber includes:
        one or more process chambers; and
        a transfer chamber configured to transfer the substrate to the process chambers, and
    wherein the transfer chamber includes:
        a housing having a transfer space in which the substrate is transferred;
        a transfer robot disposed in the housing and configured to transfer the substrate between the process chambers;
        an electrostatic pad provided in the transfer space and configured to electro-statically attract particles in the housing; and
        a drive unit,
    wherein the drive unit includes:
        a main body having an opening formed therein; and
        a sealing belt located to face the opening and configured to seal the opening, and
        wherein a bracket coupled with the transfer robot is coupled to the sealing belt such that the bracket overlaps with the sealing belt between opposing edges of the opening,
    wherein the electrostatic pad includes:
        a first pad formed of a material configured to attract positively charged particles; and
        a second pad formed of a material configured to attract negatively charged particles, and
    wherein the first pad contains one of Teflon, silicone, polyethylene, and vinyl chloride.

2. The apparatus of claim 1, wherein the electrostatic pad is provided in the drive unit.

3. The apparatus of claim 2, wherein the drive unit includes:
    a motor disposed in the main body and configured to move the sealing belt, and
    wherein the electrostatic pad is located in the main body so as to be adjacent to the opening.

4. The apparatus of claim 1, wherein the electrostatic pad is attached to an inner wall of the housing.

5. The apparatus of claim 1, wherein the electrostatic pad is provided on a sidewall parallel to a direction of movement of the transfer robot among sidewalls of the housing.

6. The apparatus of claim 1, wherein the transfer chamber further includes a fan filter unit configured to generate a vertical air flow in the housing.

7. The apparatus of claim 1, wherein a plurality of first pads and a plurality of second pads are provided, and
    wherein the first pads and the second pads are alternately disposed.

8. The apparatus of claim 1, wherein the second pad contains one of nylon, acetate, and aluminum.

9. A transfer unit comprising:
    a housing having a space in which a substrate is transferred;
    a transfer robot disposed in the housing and configured to transfer the substrate between treatment chamber;
    an electrostatic pad provided in the housing and configured to electro-statically attract particles in the housing; and
    a drive unit configured to moves the transfer robot,
    wherein the drive unit includes:
        a main body having an opening formed therein; and
        a sealing belt located to face the opening and configured to seal the opening, and
    wherein a bracket coupled with the transfer robot is coupled to the sealing belt such that the bracket overlaps with the sealing belt between opposing edges of the opening,
    wherein the electrostatic pad includes:
        a first pad formed of a material configured to attract positively charged particles; and
        a second pad formed of a material configured to attract negatively charged particles, and
    wherein the first pads contain one of Teflon, silicone, polyethylene, and vinyl chloride.

10. The transfer unit of claim 9, wherein the electrostatic pad is provided in the drive unit.

11. The transfer unit of claim 10, wherein the drive unit includes:
    a motor disposed in the main body and configured to move the sealing belt, and
    wherein the electrostatic pad is located in the main body so as to be adjacent to the opening.

12. The transfer unit of claim 9, wherein the electrostatic pad is attached to an inner wall of the housing.

13. The transfer unit of claim 12, wherein the electrostatic pad is provided on a sidewall parallel to a direction of movement of the transfer robot among sidewalls of the housing.

14. The transfer unit of claim 12, further comprising:
a fan filter unit configured to generate a vertical air flow in the housing.

15. The transfer unit of claim 9, wherein a plurality of first pads and a plurality of second pads are provided, and wherein the first pads and the second pads are alternately disposed.

16. The transfer unit of claim 9, wherein the second pads contain one of nylon, acetate, and aluminum.

* * * * *